United States Patent
Saito et al.

(10) Patent No.: US 12,431,304 B2
(45) Date of Patent: Sep. 30, 2025

(54) INPUT DEVICE

(71) Applicant: Panasonic Intellectual Property Management Co., Ltd., Osaka (JP)

(72) Inventors: Yuta Saito, Okayama (JP); Yasunori Yanai, Okayama (JP); Takehiko Nara, Okayama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 362 days.

(21) Appl. No.: 18/005,598

(22) PCT Filed: Jul. 1, 2021

(86) PCT No.: PCT/JP2021/025000
§ 371 (c)(1),
(2) Date: Jun. 3, 2023

(87) PCT Pub. No.: WO2022/024659
PCT Pub. Date: Feb. 3, 2022

(65) Prior Publication Data
US 2023/0307194 A1  Sep. 28, 2023

(30) Foreign Application Priority Data
Jul. 29, 2020  (JP) .................. 2020-128645

(51) Int. Cl.
*H01H 13/20* (2006.01)
*H01H 13/14* (2006.01)

(52) U.S. Cl.
CPC ............ *H01H 13/20* (2013.01); *H01H 13/14* (2013.01)

(58) Field of Classification Search
CPC .......... H01H 13/20; H01H 13/14; H01H 3/12; H01H 5/00; H01H 5/04; H01H 5/30;
(Continued)

(56) References Cited

U.S. PATENT DOCUMENTS 10,162,425 B2 * 12/2018 Nakamura ............. H01H 13/78
11,460,932 B2 * 10/2022 Saito ....................... G06F 3/038
11,909,389 B2 *  2/2024 Yamabayashi ....... H03K 17/955

FOREIGN PATENT DOCUMENTS

JP   51-059527 U   5/1976
JP   2002-373541   12/2002
(Continued)

OTHER PUBLICATIONS

International Search Report of PCT application No. PCT/JP2021/025000 dated Sep. 14, 2021.

*Primary Examiner* — Lheiren Mae A Caroc
(74) *Attorney, Agent, or Firm* — Rimon P.C.

(57) ABSTRACT

An input device of the present disclosure includes a first fixed electrode, a second fixed electrode electrically insulated from the first fixed electrode, an elastic body having conductivity and positioned above the first fixed electrode and the second fixed electrode, a movable member that is positioned above the elastic body and is configured to push the elastic body toward the first fixed electrode, and an insulating layer that is positioned between the first fixed electrode and the elastic body and insulates the first fixed electrode and the elastic body from each other. The second fixed electrode and the elastic body are in contact with each other.

12 Claims, 8 Drawing Sheets

(58) Field of Classification Search
CPC ........ H01H 13/22; H01H 13/26; H01H 13/48;
H01H 13/50; H01H 13/506; H01H 13/52;
H01H 2227/022; H03K 2017/9755; H03K
2217/96062; H03K 17/975; H02H
2215/004
See application file for complete search history.

(56) References Cited

FOREIGN PATENT DOCUMENTS

| | | |
|---|---|---|
| JP | 2002-373548 | 12/2002 |
| JP | 2014-123430 | 7/2014 |
| WO | 2019/230517 | 12/2019 |

\* cited by examiner

// INPUT DEVICE

TECHNICAL FIELD

The present disclosure relates generally to an input device, and in more detail, to an input device used as a pressure sensor.

BACKGROUND ART

An input device described in Patent Literature 1 includes an operated portion (movable member) and a plurality of pressure sensors of an electrostatic capacitance type. Each of a plurality of pressure sensors includes an electrode, a presser, an insulator, and an elastic body. The insulator and the elastic body are disposed between the electrode and the presser. When the elastic body is pushed by the presser, the electrostatic capacitance of a plurality of pressure sensors increases as a push amount increases.

CITATION LIST

Patent Literature

PTL 1: WO 2019/230517 A

SUMMARY OF THE INVENTION

In a configuration of an input device described in Patent Literature 1, the magnitude of electrostatic capacitance created in a pressure sensor may not be sufficient. When the magnitude of the electrostatic capacitance is small, the amount of change in the electrostatic capacitance that occurs by pressing the elastic body is also small, which makes it difficult to detect the change in electrostatic capacitance.

An input device according to the present disclosure includes a first fixed electrode, a second fixed electrode electrically insulated from the first fixed electrode, an elastic body having conductivity and positioned on above the first fixed electrode and the second fixed electrode, a movable member that is positioned above the elastic body and is configured to push the elastic body toward the first fixed electrode, and an insulating layer that is positioned between the first fixed electrode and the elastic body and insulates the first fixed electrode and the elastic body from each other, where the second fixed electrode and the elastic body are in contact with each other.

The input device of the present disclosure makes it easy to detect a change in electrostatic capacitance.

DESCRIPTION OF EMBODIMENT

Exemplary Embodiment

Hereinafter, input device 1 according to an exemplary embodiment will be described below with reference to the drawings. The exemplary embodiment described below is merely one of various exemplary embodiments of the present disclosure. Provided that an object of the present disclosure is achieved, the following exemplary embodiment can be modified in various ways according to design and the like. Furthermore, each figure described in the following exemplary embodiments is a schematic view, and each ratio of sizes and thicknesses of components in a figure does not necessarily reflect the actual dimensional ratio.

Note that, in the present disclosure, the description will be given using terms indicating directions such as "above", "below", "upper side", and "lower side". However, these terms merely indicate relative positional relationships, and do not limit the present disclosure.

(1) Outline

Input device 1 is used as a pressure sensor. Input device 1 outputs a signal corresponding to the magnitude of a pressure applied to input device 1. Input device 1 is applicable as, for example, a device used for giving an input to various electronic devices. Specifically, for example, input device 1 is held in a housing of electronic device 100 (see FIG. 2), and outputs an input signal to controller 101 housed in the housing of electronic device 100. Controller 101 of electronic device 100 may output a control signal to a circuit module housed in the housing of electronic device 100 based on an input signal from input device 1. Controller 101 described herein includes, as a main component, a computer system including one or more processors and one or more memories. In controller 101, functions of parts of controller 101 are realized by one or more processors executing a program recorded in a memory. The programs may be recorded in advance in the memory, may be provided through a telecommunication line such as the Internet, or may be recorded in a non-transitory recording medium such as a memory card to be provided.

Figure 1:
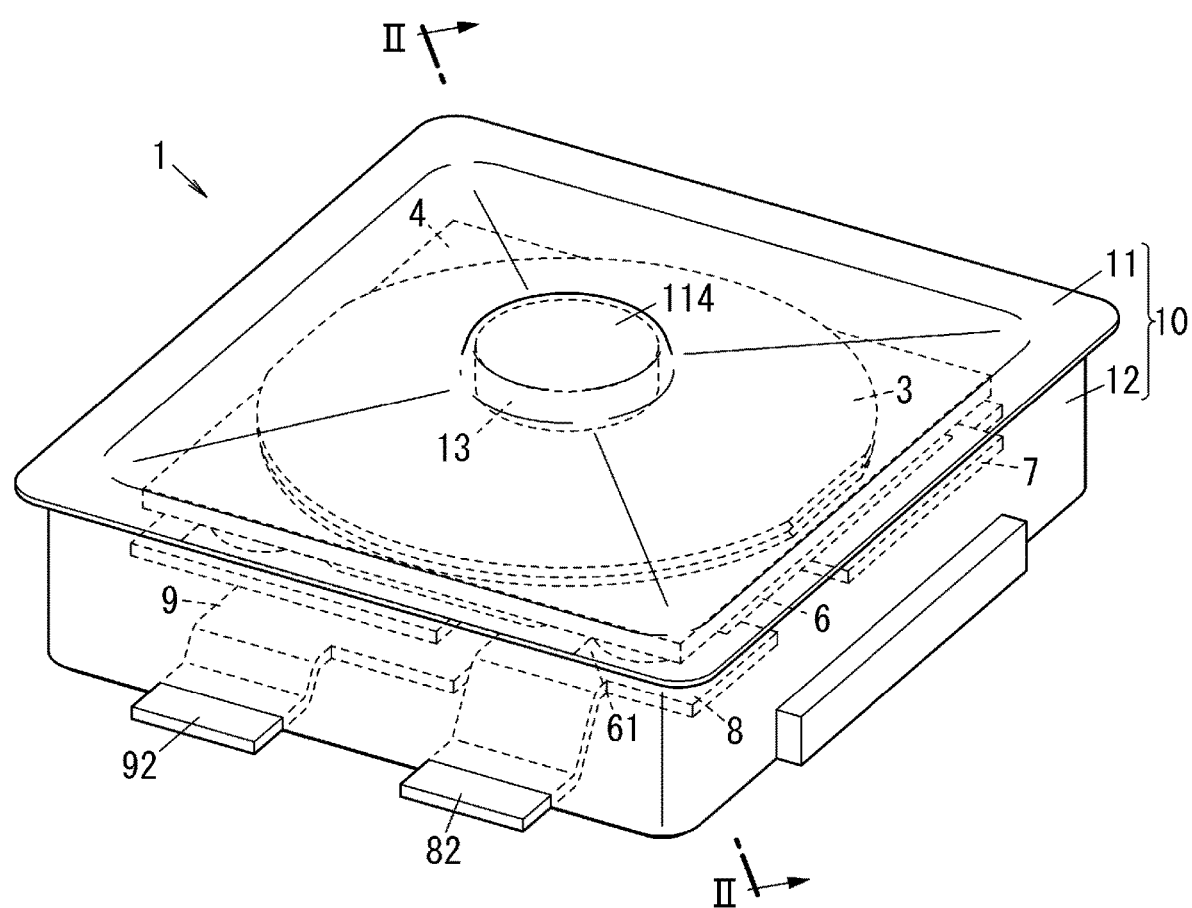
FIG. 1 is a perspective view of an input device according to one exemplary embodiment.
Figure 2:
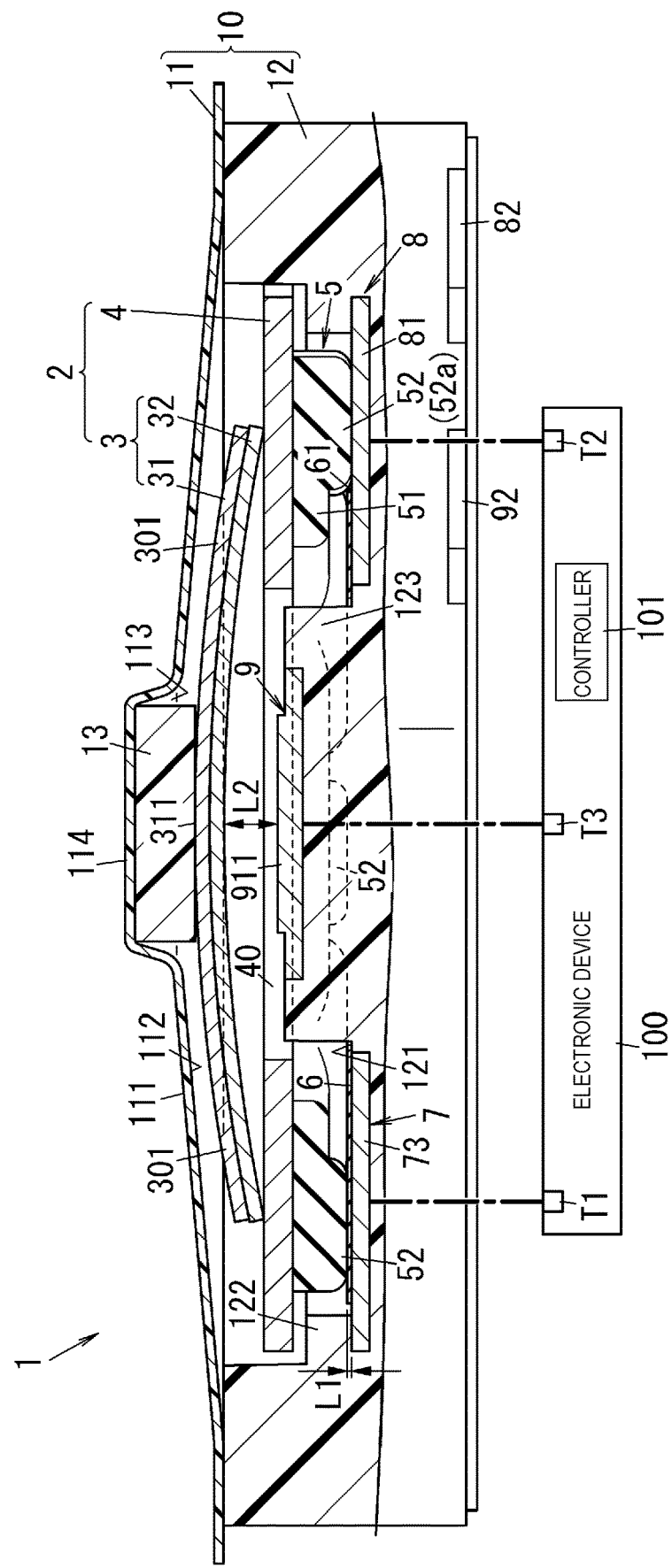
FIG. 2 is a cross-sectional view corresponding to II-II cross section in FIG. 1, and illustrates a state before a force is applied to the input device.

As illustrated in FIG. 1 and FIG. 2, input device 1 according to the present exemplary embodiment includes first fixed electrode 7, second fixed electrode 8, elastic body 5, and movable member 2. Second fixed electrode 8 and first fixed electrode 7 are electrically insulated from each other. Elastic body 5 has conductivity. Elastic body 5 is disposed so as to overlap first fixed electrode 7 and second fixed electrode 8 as viewed from above. Note that "above" in the present disclosure means that on the upper side in FIG. 4. Movable member 2 includes pressure receiver 311 to which a force is applied. When a force is applied to pressure receiver 311, movable member 2 pushes elastic body 5 toward first fixed electrode 7 and second fixed electrode 8. First fixed electrode 7 and elastic body 5 are electrically insulated from each other via an insulating layer. In the present exemplary embodiment, input device 1 includes insulating sheet 6, and insulating sheet 6 functions as the insulating layer. Second fixed electrode 8 and elastic body 5 are in contact with each other.

In input device 1, first fixed electrode 7, and elastic body 5 constitute a capacitor. In other words, electrostatic capacitance C1 is formed between first fixed electrode 7 and elastic body 5. That is, electrostatic capacitance C1 corresponding to thickness L1 of the insulating layer (insulating sheet 6) is formed between first fixed electrode 7 and elastic body 5. For example, elastic body 5 comes into contact with second fixed electrode 8 to be electrically connected to second fixed electrode 8. That is, first fixed electrode 7 and second fixed electrode 8 are connected via a capacitor having electrostatic capacitance C1.

A force applied to pressure receiver 311 of movable member 2 deforms elastic body 5 to change electrostatic capacitance C1. Electrostatic capacitance C1 can be measured using first fixed electrode 7 and second fixed electrode 8 as measurement terminals. Since electrostatic capacitance C1 takes a value corresponding to the force (pressure) applied to pressure receiver 311, the force applied to pressure receiver 311 is obtained based on electrostatic capacitance C1.

Various conventionally known methods can be adopted as a method for measuring electrostatic capacitance C1. As an example, a switched capacitor system can be used. In the switched capacitor system, (a change in) the electrostatic capacitance of a capacitor targeted to be measured (in this case, the capacitor including first fixed electrode 7 and elastic body 5 as opposing electrodes) is measured based on the amount of electric charge accumulated in the target capacitor. For example, in the switched capacitor system, a charging process of charging the target capacitor and a discharging process of discharging the target capacitor to take out the charge accumulated in the target capacitor and use this charge to charge a capacitor for determination are alternately repeated for a predetermined period. Charging and discharging are performed via first fixed electrode 7 and second fixed electrode 8 of input device 1. When the voltage across two terminals of the capacitor for determination reaches a specific value, the discharging process is ended and the charging process is started. That is, a larger the electrostatic capacitance of the target capacitor is, the number of times the voltage across the two ends of the capacitor for determination reaches the specific value in the predetermined period increases. Thus, the electrostatic capacitance of the target capacitor can be measured based on the number of times the voltage across the two ends of the capacitor for determination reaches the specific value in the predetermined period.

As an input device according to a comparative example that is compared with input device 1 of the present exemplary embodiment, a configuration in which second fixed electrode 8 and elastic body 5 are electrically insulated from each other via an insulating layer is considered. In the input device of the comparative example, electrostatic capacitance C measured using first fixed electrode 7 and second fixed electrode 8 as measurement terminals is expressed by [Formula 1].

$$C = C1 \times C2/(C1+C2) \qquad \text{[Formula 1]}$$

Here, C1 is the electrostatic capacitance between first fixed electrode 7 and elastic body 5, and C2 is the electrostatic capacitance between second fixed electrode 8 and elastic body 5. When C1 and C2 is larger than 0, a relationship of C<C1 is true.

In input device 1 of the present exemplary embodiment, electrostatic capacitance C1 measured using first fixed electrode 7 and second fixed electrode 8 as measurement terminals is larger than the electrostatic capacitance of the input device of the comparative example. This allows input device 1 of the present exemplary embodiment to easily detect a change in electrostatic capacitance.

It may be difficult for the input device of the comparative example to increase the electrostatic capacitance by increasing the areas of first fixed electrode 7, second fixed electrode 8, and elastic body 5 due to restriction on dimensions of the input device. In the configuration of input device 1 of the present exemplary embodiment, the electrostatic capacitance can be increased without increasing the dimensions as compared with the input device of the comparative example.

Figure 8:
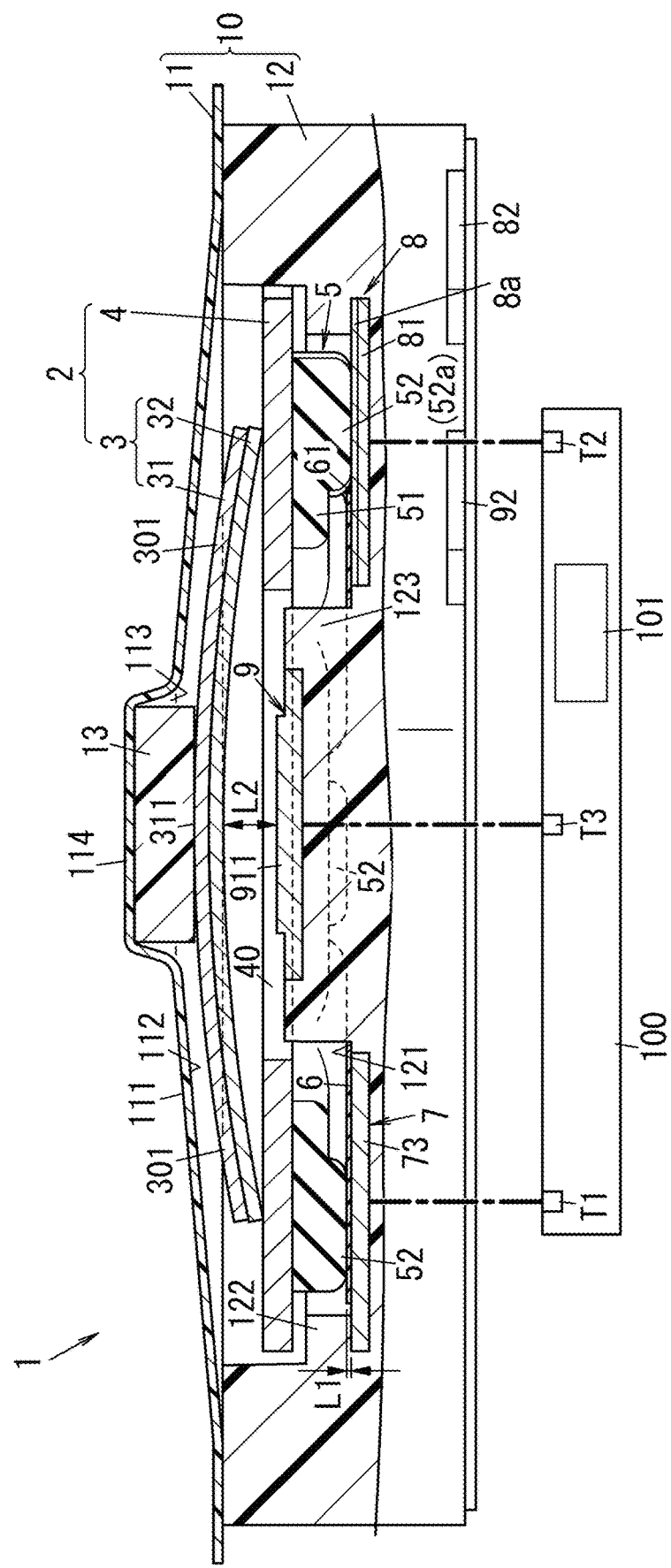
FIG. 8 is a cross-sectional view of an input device according to another exemplary modification.

Note that, what is required is that second fixed electrode 8 is in contact with elastic body 5. It is not essential that second fixed electrode 8 is electrically connected to elastic body 5. For example, when an oxide film is formed on a surface of second fixed electrode 8 due to oxygen in the air (that is, when second fixed electrode 8 includes an oxide film 8a, as shown in FIG. 8), second fixed electrode 8 and elastic body 5 are electrically insulated by the oxide film 8a. In this case, electrostatic capacitance C2 is formed between second fixed electrode 8 and elastic body 5. Since the thickness of the oxide film 8a is generally as extremely thin as several nanometers, electrostatic capacitance C2 takes a very large value. When the oxide film 8a has been formed, electrostatic capacitance C measured using first fixed electrode 7 and second fixed electrode 8 as measurement terminals is expressed by [Formula 1]. However, even in this case, electrostatic capacitance C2 is very large as compared with a case where an insulating layer which is separate from second fixed electrode 8 is provided between second fixed electrode 8 and elastic body 5. Thus, electrostatic capacitance C given by [Formula 1] takes a large value as compared with the electrostatic capacitance of the input device of the comparative example. Since formation of an oxide film 8a on a surface of second fixed electrode 8 is allowed, there is no need to provide plating or the like for suppressing oxidation on second fixed electrode 8, and thus the cost can be reduced.

In addition, a contact resistance may be formed between second fixed electrode 8 and elastic body 5. However, since the electrostatic capacitance is generally measured by an AC signal such as by the switched capacitor system, contact resistance hardly affects the measurement. Since second fixed electrode 8 and elastic body 5 need not be electrically connected to each other, there is no need to provide plating or the like on second fixed electrode 8 to improve conductivity, and thus the cost can be reduced. In addition, since second fixed electrode 8 and elastic body 5 need not be electrically connected to each other, the magnitude of voltage applied to second fixed electrode 8 and elastic body 5 can be reduced.

Described in detail later is that input device 1 gives a click feeling (moderation feeling) to operating body U1 (operator) who applies a force to pressure receiver 311 by buckling of a part of movable member 2. Input device 1 further includes third fixed electrode 9 as a configuration for detecting whether buckling has occurred.

(2) Details

Input device 1 of the present exemplary embodiment will be described below in more detail with reference to FIGS. 1 to 5. Input device 1 includes housing 10 and pusher 13 besides first fixed electrode 7, second fixed electrode 8, third fixed electrode 9, insulating sheet 6, elastic body 5, and movable member 2.

In the following description, the side on which first fixed electrode 7 and second fixed electrode 8 are disposed with respect to movable member 2 is referred to as a lower side, and the side on which movable member 2 is disposed with respect to first fixed electrode 7 and second fixed electrode 8 is referred to as an upper side. However, this definition is not intended to limit the direction along which input device 1 is used. Movable member 2 is disposed below pusher 13. Elastic body 5 is disposed below movable member 2. Insulating sheet 6, first fixed electrode 7, and second fixed electrode 8 are disposed below elastic body 5. Third fixed electrode 9 is disposed below movable member 2 to oppose movable member 2.

(2.1) Housing

Housing 10 includes cover 11 and body 12. With cover 11 and body 12 coupled to each other, housing 10 forms a storage space. Housing 10 stores first fixed electrode 7, second fixed electrode 8, third fixed electrode 9, insulating sheet 6, elastic body 5, movable member 2, and pusher 13 in the storage space.

Body 12 has a rectangular parallelepiped shape. Body 12 has a recess 120 of which one face (upper surface) is opened. Cover 11 has a form of a film having a quadrangle (for example, rectangle) shape in a plan view. The "rectangle" includes a square shape and a rectangle shape. Cover 11 is attached to body 12 so as to cover the opening of recess 120 of body 12.

Stopper 122 is provided on side surfaces of recess 120 of body 12. As viewed from above, stopper 122 has an annular (rectangular frame) shape. As described later, stopper 122 restricts the movement of movable member 2.

Body 12 further includes pedestal 123. Pedestal 123 protrudes from bottom surface 121 of recess 120. Pedestal 123 protrudes from the central portion of bottom surface 121. Pedestal 123 has a columnar shape.

Figure 4:
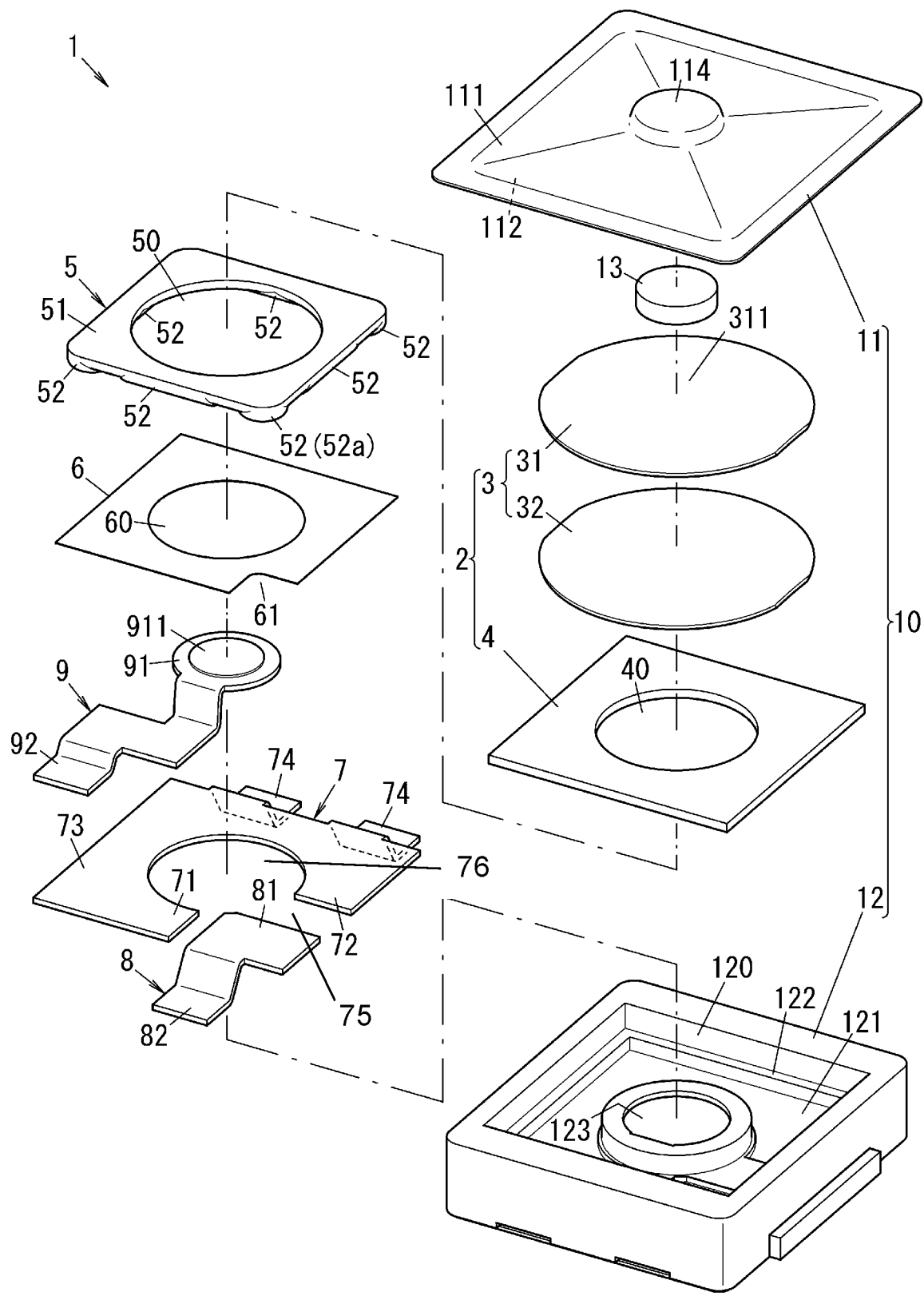
FIG. 4 is an exploded perspective view of the input device viewed from the upper side.
Figure 5:
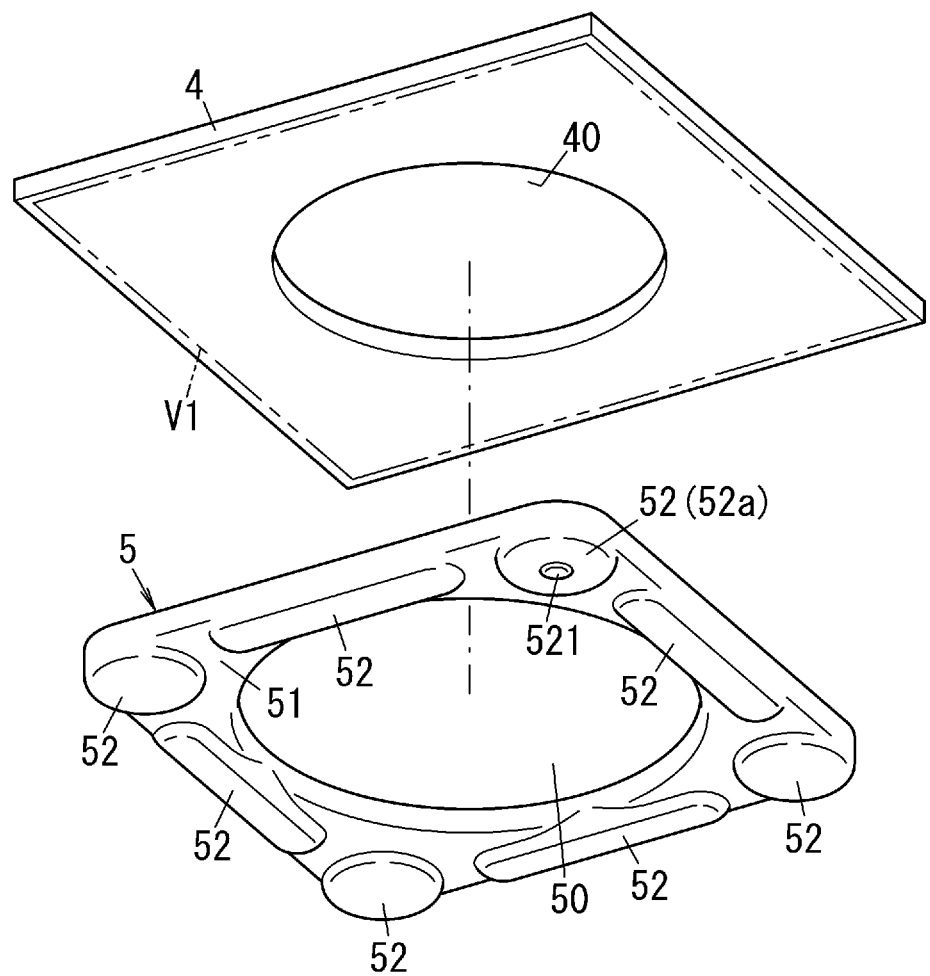
FIG. 5 is an exploded perspective view of essential parts of the input device viewed from the lower side.

As illustrated in FIG. 4, cover 11 has first surface 111 (upper surface) and second surface 112 (lower surface). Second surface 112 is a surface opposing pusher 13 and movable member 2. First surface 111 is a surface opposite to second surface 112.

As illustrated in FIG. 2, storage recess 113 is formed with cover 11. In more detail, storage recess 113 is formed in the vicinity of the center of a lower surface (second surface 112) of cover 11. Pusher 13 is housed in storage recess 113.

Cover 11 includes operated portion 114. Operated portion 114 is a portion of the upper surface (first surface 111) of cover 11. In more detail, operated portion 114 is provided in the vicinity of the center of first surface 111. Operated portion 114 is a projection. Operating body U1 (a fingertip of a person or the like, see FIG. 3) comes into contact with operated portion 114 to apply a force to cover 11.

Cover 11 and body 12 have electrical insulation properties. Cover 11 and body 12 are formed of, for example, synthetic resin material.

Cover 11 has flexibility. Accordingly, operating body U1 can apply a force to pusher 13 stored in housing 10 via cover 11. That is, when operating body U1 applies a force to operated portion 114 of cover 11 from above, pusher 13 moves downward while cover 11 is being deformed.

Note that, input device 1 preferably includes an operation plate disposed to cover cover 11. It is preferable that operating body U1 (see FIG. 3) does not directly touch cover 11 but applies a force to cover 11 via the operation plate.

(2.2) Pusher

Pusher 13 has a cylindrical shape. Pusher 13 has electrical insulation properties. Pusher 13 is disposed between cover 11 and movable member 2. Pusher 13 is fixed to cover 11 or movable member 2. Pusher 13 is desirably fixed to cover 11. Pusher 13 transmits a force applied to cover 11 to movable member 2.

(2.3) Movable Member

Movable member 2 includes click member 3 and movable electrode 4.

Click member 3 includes first plate 31 and second plate 32. First plate 31 and second plate 32 each have a disk shape. First plate 31 and second plate 32 are overlapped and mechanically connected to each other. Click member 3 may include only one of first plate 31 and second plate 32.

Click member 3 has conductivity. In the present exemplary embodiment, click member 3 includes plate materials having elasticity. For example, click member 3 includes metal plates made of stainless steel (SUS), for example. Click member 3 has a disk shape. Click member 3 is a so-called metal dome. Click member 3 is formed to have a curved dome shape that is curved so as the central portion thereof to protrude in a direction away from movable electrode 4.

A region along an outer edge of click member 3 is in contact with movable electrode 4. Click member 3 is thereby electrically connected to movable electrode 4. Click member 3 is electrically connected to elastic body 5 via movable electrode 4. Click member 3 opposes third fixed electrode 9.

Click member 3 includes pressure receiver 311 to which a force is applied by pusher 13. Pressure receiver 311 is a contact surface that contacts with pusher 13 and is the central portion of click member 3. Click member 3 is sandwiched between pusher 13 and movable electrode 4.

In the present exemplary embodiment, click member 3 is configured to perform an inverting action by a force applied to pusher 13. Specifically, click member 3 has such characteristics that a load acting on pusher 13 from click member 3 increases as a force applied to click member 3 increases until the force is as large as a predetermined magnitude, but when the magnitude of the applied force reaches the predetermined magnitude, click member 3 buckles at buckling portion 301 and the load acting on pusher 13 from click member 3 decreases. This gives a click feeling to operating body U1 (operator).

That is, click member 3 has buckling portion 301. The "buckling portion" in the present disclosure is a boundary that is created between a convex portion and a concave portion when click member 3 buckles (is inverted) by an applied force equal to or greater than the predetermined magnitude. The "convex portion" referred to herein is an outer periphery (a region remote from the center) of click member 3 in FIG. 3, and the "concave portion" is a region including the center of click member 3 in FIG. 3. In a state where no force is applied to click member 3, buckling portion 301 may not be apparently distinguishable from other portions of click member 3.

Buckling portion 301 is provided around the central portion (pressure receiver 311) of click member 3. As viewed in the up-down direction, buckling portion 301 occupies an annular region. Buckling portion 301 is provided on both first plate 31 and second plate 32.

Figure 3:
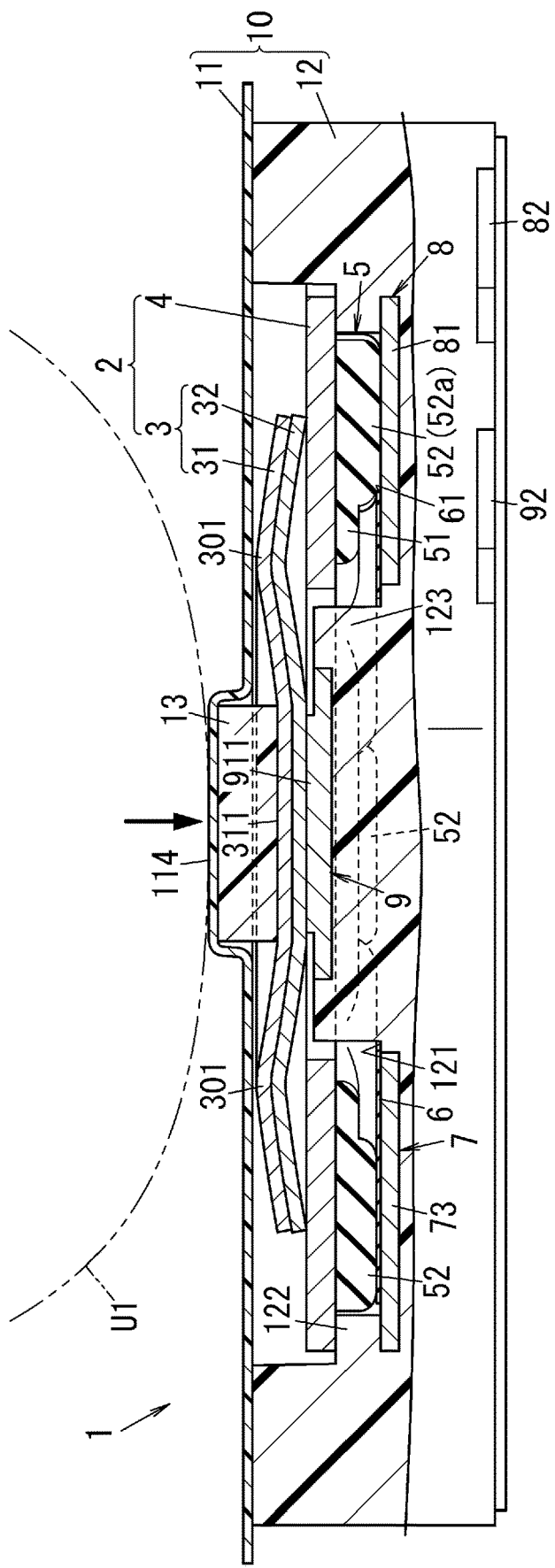
FIG. 3 is a cross-sectional view corresponding to II-II cross section in FIG. 1, and illustrates a state in which a force is applied to the input device.

When pressure receiver 311 is pushed with a force equal to or greater than the predetermined magnitude, click member 3 is deformed (buckles) at buckling portion 301, and the click member 3 flexes. As an example, as illustrated in FIG. 3, click member 3 deforms into a dome shape in which the central portion (pressure receiver 311) of click member 3 protrudes in a direction away from pusher 13 (to the lower side). When buckling portion 301 is deformed as illustrated in FIG. 3, the load acting on pusher 13 from click member 3 decreases.

As click member 3 buckles at buckling portion 301, the distance between pressure receiver 311 of click member 3 and third fixed electrode 9 changes. In more detail, as click member 3 buckles at buckling portion 301, pressure receiver 311 approaches third fixed electrode 9.

When the force applied to pressure receiver 311 is removed, click member 3 returns to the shape that click member 3 takes before the force is applied.

Movable electrode 4 is made of metal material. Movable electrode 4 has conductivity. Movable electrode 4 is made of a plate material. Movable electrode 4 has a frame shape. The outer peripheral edge of movable electrode 4 has a rectangular shape. Movable electrode 4 has through-hole 40 at the central portion thereof. Through-hole 40 has a circular shape. Movable electrode 4 is sandwiched between elastic body 5 and click member 3.

The elastic modulus of movable electrode 4 is larger than the elastic modulus of elastic body 5. That is, movable member 2 has a larger elastic modulus than elastic body 5, and includes a push member (movable electrode 4) that pushes elastic body 5 by a force applied to pressure receiver 311.

(2.4) Elastic Body

Elastic body 5 is a rubber that has conductivity. In more detail, elastic body 5 is formed such that conductive particles such as carbon particles are uniformly dispersed in rubber that is an insulator.

Elastic body 5 is formed in a plate shape as a whole. As viewed from the thickness direction of elastic body 5, the outer peripheral edge of elastic body 5 has a rectangular shape. Elastic body 5 has through hole 50 in the central portion thereof. Through hole 50 has a circular shape. Pedestal 123 of body 12 is disposed in through hole 50.

Elastic body 5 includes base 51 and a plurality of (eight in FIG. 5) protrusions 52. Base 51 has a plate shape. The outer peripheral edge of base 51 has a rectangular shape. The plurality of protrusions 52 protrudes from one of surfaces, facing the thickness direction, of base 51. A surface of base 51 on which the plurality of protrusions 52 is not provided is in contact with movable electrode 4.

The plurality of protrusions 52 is arranged in the circumferential direction of base 51. In more detail, protrusions 52 are provided at places that are on four sides and four corners of base 51 having a rectangular shape.

Elastic body 5 is in contact with first fixed electrode 7 and second fixed electrode 8 by the plurality of protrusions 52. Elastic body 5 makes contact with first fixed electrode 7 and second fixed electrode 8 not by base 51 but by the plurality of protrusions 52, so that the contact state between elastic body 5 and first fixed electrode 7 as well as second fixed electrode 8 is stable.

When a force is applied to pressure receiver 311 of movable member 2, elastic body 5 receives a force from movable member 2 (movable electrode 4) and is compressed in the up-down direction. When the force is removed, elastic body 5 returns to the shape that elastic body 5 takes before the force is applied.

(2.5) Insulating Sheet

Insulating sheet 6 has electrical insulation properties. Insulating sheet 6 has roughly a rectangular plate shape. Insulating sheet 6 has through hole 60 in the central portion thereof. Through hole 60 has a circular shape. Pedestal 123 of body 12 is disposed in through hole 60. Furthermore, insulating sheet 6 has cutout 61. Cutout 61 is provided at one of four corners of insulating sheet 6.

(2.6) Fixed Electrode

Each of first fixed electrode 7, second fixed electrode 8, and third fixed electrode 9 is made of a metal plate having electric conductivity. First fixed electrode 7, second fixed electrode 8, and third fixed electrode 9 are electrically insulated from each other. First fixed electrode 7 and second fixed electrode 8 output an electric signal including information on a change in electrostatic capacitance C1 between first fixed electrode 7 and elastic body 5.

Electrostatic capacitance C3 corresponding to distance L2 between third fixed electrode 9 and click member 3 is formed between third fixed electrode 9 and click member 3. As will be described later, first fixed electrode 7 and third fixed electrode 9 output an electric signal including information on a change in combined capacitance of electrostatic capacitance C1 between first fixed electrode 7 and elastic body 5 and electrostatic capacitance C3 between third fixed electrode 9 and click member 3.

First fixed electrode 7, second fixed electrode 8, and third fixed electrode 9 are integrated with body 12 by insert molding. That is, body 12 is formed by insert molding with first fixed electrode 7, second fixed electrode 8, and third fixed electrode 9 as inserts. First fixed electrode 7 and second fixed electrode 8 are positioned on the lower side of elastic body 5.

First fixed electrode 7 has first end 71, second end 72, and connecting portion 73. Connecting portion 73 is formed in an arc shape connecting first end 71 and second end 72. First fixed electrode 7 is formed such that a structure including first end 71, second end 72, and connecting portion 73 form a C shape. In other words, first fixed electrode 7 has such a shape that is formed by cutting away cutout 75 and through hole 76 from a substantially square shape. First end 71, second end 72, and connecting portion 73 are disposed around pedestal 123 of body 12. First end 71, second end 72, and connecting portion 73 are exposed on bottom surface 121 of recess 120 of body 12.

Furthermore, first fixed electrode 7 has a plurality of (two in FIG. 4) first terminals 74. Each of first terminals 74 penetrates body 12 and is exposed to the outside of body 12.

Second fixed electrode 8 includes tongue portion 81 and second terminal 82. Tongue portion 81 is exposed on bottom surface 121 of recess 120 of body 12. Second terminal 82 penetrates body 12 and is exposed to the outside of body 12.

First fixed electrode 7 and second fixed electrode 8 are disposed on the same plane. In more detail, first end 71, second end 72, and connecting portion 73 of first fixed electrode 7 and tongue portion 81 of second fixed electrode 8 are disposed on the same plane.

Second fixed electrode 8 is positioned so as not to overlap first fixed electrode 7 as viewed from above. Second fixed electrode 8 is disposed near first end 71 and second end 72. In more detail, second fixed electrode 8 is disposed so as tongue portion 81 to be adjacent to first end 71 and second end 72. That is, second fixed electrode 8 is disposed in cutout 75 of first fixed electrode 7.

The area of a region where first fixed electrode 7 overlaps elastic body 5 (first end 71, second end 72, and connecting portion 73) as viewed from above is larger than the area of a region where second fixed electrode 8 overlaps elastic body 5 (tongue portion 81) as viewed from above.

Third fixed electrode 9 includes electrode portion 91 and third terminal 92. Electrode portion 91 is disposed so as to be exposed above an upper surface of pedestal 123 of body 12. Central portion 911 of electrode portion 91 protrudes from the periphery thereof. Electrode portion 91 is disposed on the lower side of click member 3. Electrode portion 91 opposes click member 3. In more detail, electrode portion 91 opposes click member 3 via through hole 40 of movable electrode 4. Third terminal 92 penetrates body 12 and is exposed to the outside of body 12.

The plurality of first terminals 74, second terminal 82, and third terminal 92 are mechanically coupled and electrically connected by soldering to, for example, a conductive member on a printed board.

As illustrated in FIG. 2, insulating sheet 6 is sandwiched between connecting portion 73 of first fixed electrode 7 and some of the plurality of protrusions 52 of elastic body 5. This electrically insulates first fixed electrode 7 from elastic body 5. Some of the plurality of protrusions 52 are positioned above first fixed electrode 7 and are in contact with first fixed electrode 7 via insulating sheet 6 (insulating layer), but protrusion 52 and first fixed electrode are electrically insulated from each other by insulating sheet 6.

At least a part of tongue portion 81 of second fixed electrode 8 overlaps cutout 61 of insulating sheet 6 as viewed from above. Elastic body 5 is disposed above insulating sheet 6. Protrusion 52a, which is one of the plurality of protrusions 52 of elastic body 5, is disposed so as to overlap cutout 61 of insulating sheet 6 as viewed from above. Thus, tongue portion 81 of second fixed electrode 8 and protrusion 52a directly contact each other. With this configuration, second fixed electrode 8 is electrically connected to elastic body 5. On the lower surface of protrusion 52a, projection 521 that further protrudes is provided (see FIG. 5). At least a part of second fixed electrode 8 is in contact with elastic body 5 via insulating sheet 6. That is, a part of second fixed electrode 8 is in contact with a part of insulating sheet 6.

(2.7) Electronic Device

As illustrated in FIG. 2, input device 1 is used with, for example, electronic device 100. Electronic device 100 processes an input signal from input device 1. Electronic device 100 thereby measures electrostatic capacitance C1 between first fixed electrode 7 and elastic body 5. Electronic device 100 processes an input signal from input device 1 to detect whether click member 3 has buckled at buckling portion 301. That is, electronic device 100 detects whether click member 3 has deformed by processing the input signal from input device 1.

Electronic device 100 includes controller 101, first terminal portion T1, second terminal portion T2, and third terminal portion T3.

Controller 101 processes input signals from input device 1 that is input via first terminal portion T1, second terminal portion T2, and third terminal portion T3. First terminal portion T1 is electrically connected to first fixed electrode 7. Second terminal portion T2 is electrically connected to second fixed electrode 8. Third terminal portion T3 is electrically connected to third fixed electrode 9.

A capacitor having first fixed electrode 7 and elastic body 5 as opposing electrodes is connected to an electric path between first terminal portion T1 and second terminal portion T2. That is, first terminal portion T1 is electrically connected to first fixed electrode 7, first fixed electrode 7 opposes elastic body 5 via insulating sheet 6, elastic body 5 is electrically connected to second fixed electrode 8, and second fixed electrode 8 is electrically connected to second terminal portion T2.

A series circuit including a capacitor having first fixed electrode 7 and elastic body 5 as opposing electrodes and a capacitor having third fixed electrode 9 and click member 3 as opposing electrodes is connected to an electric path between first terminal portion T1 and third terminal portion T3. That is, first terminal portion T1 is electrically connected to first fixed electrode 7, and first fixed electrode 7 opposes elastic body 5 via insulating sheet 6. Furthermore, elastic body 5 is electrically connected to click member 3 via movable electrode 4, click member 3 opposes third fixed electrode 9, and third fixed electrode 9 is electrically connected to third terminal portion T3.

One of first fixed electrode 7 and a set of second fixed electrode 8 and third fixed electrode 9 is electrically connected to the ground. In the present exemplary embodiment, first terminal portion T1 is a conductive electrode, and second terminal portion T2 and third terminal portion T3 are grounding electrodes. Therefore, the set of second fixed electrode 8 and third fixed electrode 9 is electrically connected to the ground. In this case, click member 3 is electrically connected to the ground via second fixed electrode 8, so that click member 3 can be used as a shield, and noise can be suppressed. Note that, it may be configured that first terminal portion T1 is a grounding electrode, second terminal portion T2 and third terminal portion T3 are conductive electrodes, and first fixed electrode 7 is electrically connected to the ground.

(3) Operation Example

An operation example in which input device 1 receives a force from operating body U1 (see FIG. 3) will be described below.

Movable electrode 4 supports click member 3, and click member 3 pushes movable electrode 4 toward the lower side by a force from the operating body U1. When the magnitude of the force from operating body U1 becomes equal to or more than a predetermined magnitude, click member 3 buckles at buckling portion 301.

When movable electrode 4 is pushed by the force applied by operating body U1, elastic body 5 is compressed in the up-down direction and deforms to expand in a direction orthogonal to the up-down direction. The deformation of elastic body 5 changes electrostatic capacitance C1 between elastic body 5 and first fixed electrode 7. First fixed electrode 7 and second fixed electrode 8 output analog electric signals including information on the change in electrostatic capacitance C1. Controller 101 of electronic device 100 measures electrostatic capacitance C1 based on the electric signals. Furthermore, controller 101 obtains the magnitude of the force applied to input device 1 based on electrostatic capacitance C1. Controller 101 may directly obtain the magnitude of the force applied to input device 1 based on the electric signals output from first fixed electrode 7 and second fixed electrode 8.

When the magnitude of the force applied by operating body U1 becomes equal to or more than a predetermined magnitude to cause click member 3 to buckle at buckling portion 301, click member 3 approaches third fixed electrode 9. This causes a change in electrostatic capacitance C3 between third fixed electrode 9 and click member 3. First fixed electrode 7 and third fixed electrode 9 output analog electric signals including information on the change in electrostatic capacitance C3. In more detail, first fixed electrode 7 and third fixed electrode 9 output electric signals including information corresponding to a combined capacitance of electrostatic capacitance C1 and electrostatic capacitance C3. Controller 101 of electronic device 100 measures electrostatic capacitance C3 or the combined capacitance of electrostatic capacitance C1 and electrostatic capacitance C3 based on the electric signals. Controller 101 detects whether click member 3 has buckled based on obtained electrostatic capacitance C3 or the combined capacitance. For example, controller 101 detects that buckling portion 301 has buckled when the obtained magnitude of electrostatic capacitance C3 or the combined capacitance exceeds a predetermined threshold value.

In the present exemplary embodiment, when click member 3 buckles at buckling portion 301, click member 3 comes into contact with third fixed electrode 9. It is not necessary that click member 3 comes into contact with third fixed electrode 9 when click member 3 buckles at buckling portion 301.

As described above, controller 101 detects the magnitude of the force applied to input device 1 and whether click member 3 has buckled. Controller 101 can determine the state of operation (operation input) performed by operating body U1 based on the detection result. The operation input that can be determined by controller 101 may include, for example, a touch operation, a push operation, and a click operation given to input device 1. The touch operation means a state in which the magnitude of a load given by the operation is equal to or less than a predetermined value and click member 3 has not buckled at buckling portion 301. The push operation means a state in which the magnitude of a load given by the operation is equal to or more than the predetermined value and click member 3 has not buckled at buckling portion 301. The click operation means a state in which click member 3 has buckled at buckling portion 301 (a state in which a click feeling has been generated).

Controller 101 determines to which operation input the operation input given to input device 1 corresponds, and outputs a control signal corresponding to the state of operation to the outside (another circuit module or the like).

(4) Stopper

Elastic body 5 is compressed in the up-down direction in response to the force applied to pressure receiver 311 of click member 3. The compressed amount of elastic body 5 is restricted by stopper 122 of body 12.

As illustrated in FIG. 2, when no force is applied to pressure receiver 311, elastic body 5 is in a non-compressed state. In this state, movable electrode 4 sandwiched between elastic body 5 and click member 3 is opposing stopper 122 disposed on the lower side of movable electrode 4 with a gap along the up-down direction.

When a force is applied to pressure receiver 311, movable electrode 4 moves toward the lower side as elastic body 5 is compressed. That is, movable electrode 4 approaches stopper 122. When the force exceeds a certain magnitude, movable electrode 4 comes into contact with stopper 122 as illustrated in FIG. 3. This restricts the movement of movable electrode 4. That is, movable electrode 4 cannot move toward the lower side any more. In addition, the compressed amount of elastic body 5 is restricted by restriction on the movement of movable electrode 4 toward the lower side.

That is, stopper 122 restricts the movement of movable member 2 (movable electrode 4) so as to suppress elastic body 5 pushed by movable member 2 being compressed to a predetermined thickness or less. In other words, stopper 122 restricts the movement of movable member 2 so as compressed elastic body 5 to have a predetermined thickness or more when the movement of movable member 2 is stopped by stopper 122. The predetermined thickness is substantially equal to the distance from bottom surface 121 of recess 120 to the upper surface of stopper 122.

Providing stopper 122 in input device 1 suppresses elastic body 5 receiving a load of a certain magnitude or more, whereby deterioration of elastic body 5 can be suppressed. That is, the life of elastic body 5 can be prolonged. In addition, the stroke (moving range) of movable member 2 (movable electrode 4) is restricted, so that a feeling of operating input device 1 can be made stable.

Stopper 122 restricts the movement of movable member 2 by coming into contact with at least a region along the outer edge of movable member 2 (movable electrode 4). Stopper 122 contacts a plurality of places on movable member 2 (movable electrode 4) arranged on imaginary line V1 (see FIG. 5) surrounding the center (through hole 40) of movable member 2 (movable electrode 4) to restrict the movement of movable member 2 (movable electrode 4). Imaginary line V1 is a rectangular line along the outer edge of movable electrode 4 having a rectangular shape. Movable electrode 4 comes into contact with stopper 122 by at least four sides of movable electrode 4. In this configuration, movable electrode 4 is less likely to tilt as compared with a case where stopper 122 and movable electrode 4 come into contact with each other by only one place. That is, it is easy to keep the thickness direction of movable electrode 4, which has come into contact with stopper 122, along the up-down direction.

First Exemplary Modification

Figure 6:
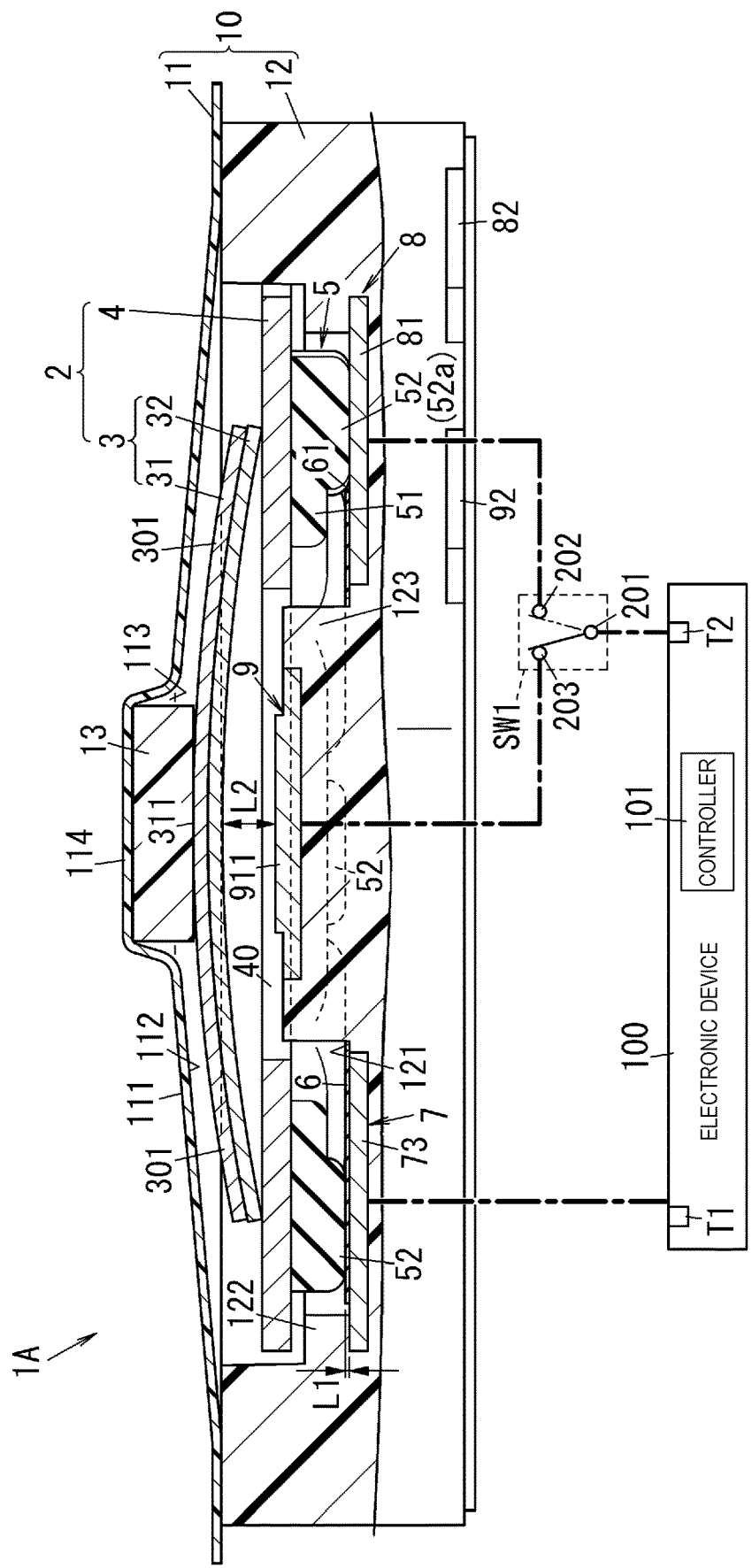
FIG. 6 is a cross-sectional view of an input device according to a first exemplary modification.

Input device 1A according to a first exemplary modification will be described below with reference to FIG. 6. The same reference numerals are given to the same components as those of the exemplary embodiment, and the description thereof will be omitted.

Input device 1A of the first exemplary modification further includes switch SW1. Switch SW1 may be a mechanical switch or a semiconductor switch. Switch SW1 has three contacts 201, 202, and 203. Switch SW1 constitutes a c-contact. Contact 201 is electrically connected to second terminal portion T2 of electronic device 100. Contact 202 is electrically connected to second fixed electrode 8. Contact 203 is electrically connected to third fixed electrode 9.

Switch SW1 is configured to be switchable between a first state in which there are conduction between contact 201 and contact 202 and no conduction between contact 201 and contact 203 and a second state in which there are conduction between contact 201 and contact 203 and no conduction contact 201 and contact 202. That is, input device 1A includes contact 201 that switches between the first state in which input device 1A is electrically connected to second fixed electrode 8 and the second state in which input device 1A is electrically connected to third fixed electrode 9. Switching of switch SW1 between the first state and the second state is controlled by controller 101 of electronic device 100.

One of contact 201 and first fixed electrode 7 is electrically connected to the ground. In the first exemplary modification, first terminal portion T1 is a conductive electrode, and second terminal portion T2 is a grounding electrode. Thus, contact 201 is electrically connected to the ground. Note that, it may be configured that first terminal portion T1 is a grounding electrode, second terminal portion T2 is a conductive electrode, and first fixed electrode 7 is electrically connected to the ground.

When switch SW1 is in the first state, input device 1 outputs an electric signal including information on a change in electrostatic capacitance C1 between elastic body 5 and first fixed electrode 7. This enables controller 101 to detect the magnitude of a force applied to input device 1. Meanwhile, when switch SW1 is in the second state, input device 1 outputs an electric signal including information on a change in electrostatic capacitance C3 between third fixed electrode 9 and click member 3. This enables controller 101 to detect whether click member 3 has buckled at buckling portion 301.

That is, by switch SW1 switching between the first state and the second state, input device 1 selectively outputs an electric signal related to detection of the magnitude of the force applied to input device 1 or an electric signal related to detection of buckling of click member 3. Controller 101 may perform switching of switch SW1 between the first state and the second state, for example, every time a predetermined time elapses, or in response to an operation made to a user interface.

Second Exemplary Modification

Figure 7:
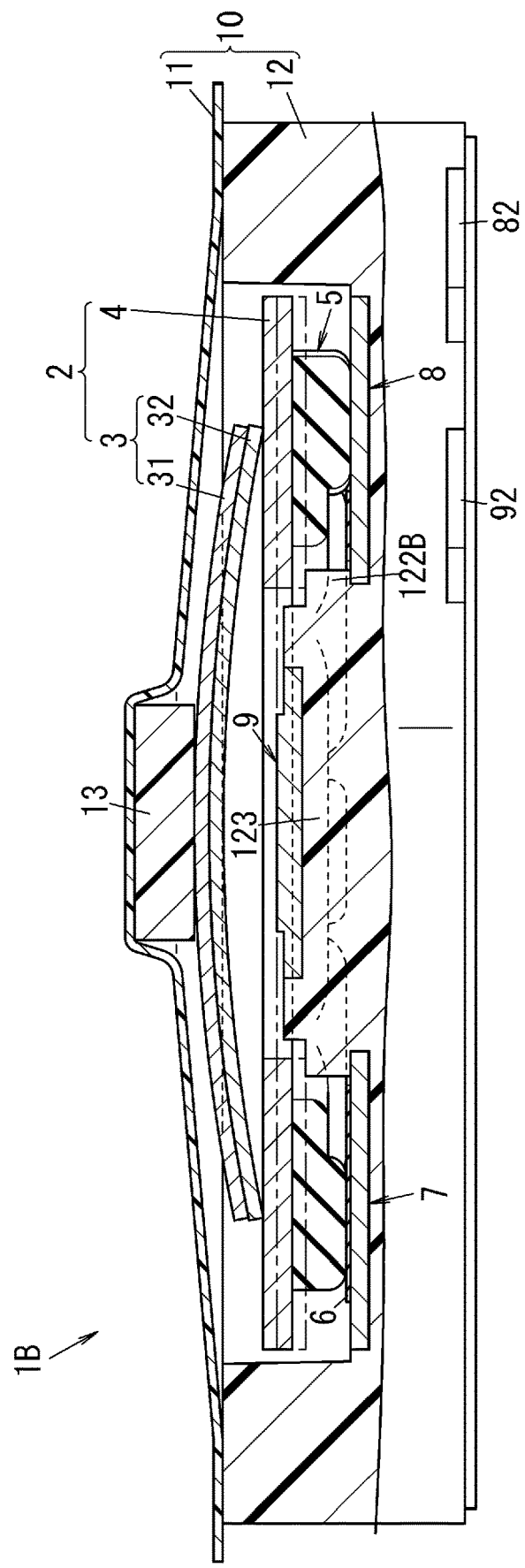
FIG. 7 is a cross-sectional view of an input device according to a second exemplary modification.

Input device 1B according to a second exemplary modification will be described below with reference to FIG. 7. The same reference numerals are given to the same components as those of the exemplary embodiment, and the description thereof will be omitted.

Input device 1 of the exemplary embodiment includes stopper 122 provided on the outer side of elastic body 5. In contrast, input device 1B of the second exemplary modification includes stopper 122B provided on the inner side of elastic body 5. In more detail, stopper 122B is formed to surround pedestal 123 of body 12. Stopper 122B is connected to pedestal 123. As viewed from above, stopper 122B has an annular shape along the shape of pedestal 123.

Similarly to the exemplary embodiment, movable electrode 4 moves toward the lower side by a force from operating body U1 to compresses elastic body 5 along the up-down direction. In FIG. 7, movable electrode 4 before being moved by the externally applied force is indicated by solid lines, and the position of a cross section of movable electrode 4 that has been moved by the externally applied force is indicated by two-dot chain lines. Movable electrode 4 moves by the operating force and comes into contact with stopper 122B. This restricts the movement of movable electrode 4.

Movable electrode 4 (frame-shaped part) of movable member 2 has been formed into a frame shape. That is, movable member 2 has a frame-shaped part. Stopper 122B restricts the movement of movable member 2 by coming into contact with at least a region along the inner edge of the frame-shaped part. In more detail, stopper 122B comes into contact with a region extending along the entire circumference of the inner edge of the frame-shaped part.

In the present second exemplary modification, stopper 122 as described in the exemplary embodiment may also be provided in a region on the outer side of elastic body 5. That is, input device 1B may include both stopper 122 provided in a region on the outer side of elastic body 5 and stopper 122B provided in a region on the inner side of elastic body 5.

Other Exemplary Modifications of Exemplary Embodiment

Other exemplary modifications of the exemplary embodiment will be described below. The following exemplary modifications may be provided by combining exemplary modifications as appropriate. The following exemplary modifications may be provided by combining with the exemplary modifications described above as appropriate.

Stopper 122 is not limited to a member continuous in the circumferential direction. Stopper 122 may include a plurality of divided members arranged along the circumferential direction.

Second fixed electrode 8 may be formed of a plurality of members. For example, second fixed electrode 8 may have, additionally to a configuration corresponding to second fixed electrode 8 of the exemplary embodiment, a conductive member formed on a surface of second fixed electrode 8 of the exemplary embodiment.

A member having electrical insulation properties may be disposed on a surface, opposing click member 3, of third fixed electrode 9.

Movable member 2, while including click member 3, may not include movable electrode 4. In this case, click member 3 is electrically connected to elastic body 5 by contacting elastic body 5 without no movable electrode 4 therebetween.

Movable member 2, while including movable electrode 4 or an electrically insulating member instead of movable electrode 4, may not include click member 3. That is, it is not essential that movable member 2 includes buckling portion 301. Movable member 2 is configured to push at least elastic body 5 toward first fixed electrode 7 and second fixed electrode 8.

The configuration of input device 1 is not limited to be used as a device used for giving an input to various electronic devices and operated by a person, but may be used, for example, for detecting the position of a device. By a device moving to a predetermined position, a force is applied from the device to input device 1 set at a predetermined position to change the state of operation of input device 1.

The insulating layer between first fixed electrode 7 and elastic body 5 is not limited to insulating sheet 6. The insulating layer may be, for example, air. That is, input device 1 may have a structure that restricts the positional relationship between first fixed electrode 7 and elastic body 5 so as to form an air gap between first fixed electrode 7 and elastic body 5.

Elastic body 5 may be divided into a plurality of members. For example, elastic body 5 may be divided into a first opposing part that opposes first fixed electrode 7 and is electrically insulated from first fixed electrode 7 via insulating sheet 6 (insulating layer) and a second opposing part that opposes second fixed electrode 8 and contacts second fixed electrode 8. In this case, the electrical connection between the first opposing part and the second opposing part may be made directly, or via movable member 2.

SUMMARY

The following aspects are disclosed from the above-described exemplary embodiments and the like.

Input device 1 (1A, 1B) according to a first aspect includes first fixed electrode 7, second fixed electrode 8 electrically insulated from first fixed electrode 7, elastic body 5 having conductivity and positioned on the upper side of first fixed electrode 7 and second fixed electrode 8, movable member 2 that is positioned above elastic body 5 and pushes elastic body 5 toward first fixed electrode 7, and insulating sheet 6 that is positioned between first fixed electrode 7 and elastic body 5 and insulates first fixed electrode 7 and elastic body 5 from each other, where second fixed electrode 8 and elastic body 5 are in contact with each other.

According to the configuration described above, electrostatic capacitance C1 measured using first fixed electrode 7 and second fixed electrode 8 as measurement terminals is larger than the electrostatic capacitance measured when second fixed electrode 8 and elastic body 5 are electrically insulated from each other via the insulating layer. This makes it easy to detect a change in the electrostatic capacitance.

In input device 1 (1A, 1B) according to a second aspect, second fixed electrode 8 includes an oxide film 8a as an upper film.

In input device 1 (1A, 1B) according to a third aspect, second fixed electrode 8 and elastic body 5 are electrically connected to each other.

In input device 1 (1A, 1B) according to a fourth aspect, movable member 2 includes click member 3, and click member 3 buckles when pushed with a force of a predetermined magnitude or more.

According to the configuration described above, an operator is given a moderation feeling (click feeling) when operating click member 3 by click member 3 buckling at buckling portion 301.

Input device 1 (1A, 1B) according to a fifth aspect further includes third fixed electrode 9 positioned on the lower side of click member 3. Click member 3 has conductivity and is in contact with elastic body 5. When movable member 2 is pushed with a force of a predetermined magnitude or more, click member 3 buckles to cause a portion of click member 3 approach the third fixed electrode.

According to the configuration described above, a combined capacitance of electrostatic capacitance C1 between first fixed electrode 7 and elastic body 5 and electrostatic capacitance C3 between click member 3 and third fixed electrode 9 can be measured using first fixed electrode 7 and third fixed electrode 9. Buckling of click member 3 can be detected based on the measured combined capacitance. Moreover, buckling of click member 3 can be stably detected without an effect of contact resistance or the like as compared with a case where buckling of click member 3 is detected by detecting conduction between click member 3 and third fixed electrode 9 created by click member 3 making contact with third fixed electrode 9.

In input device 1 (1A, 1B) according to a sixth aspect, first fixed electrode 7 is electrically connected to the ground.

According to the configuration described above, signals can be output from first fixed electrode 7, second fixed electrode 8, and third fixed electrode 9 with a simple configuration.

Input device 1A according to a seventh aspect, one of second fixed electrode 8 and third fixed electrode 9 outputs electric signal, and one of first fixed electrode 7, second fixed electrode 8, and third fixed electrode 9 is electrically connected to the ground.

According to the configuration described above, the number of output terminals of input device 1A can be reduced as compared with the sixth aspect.

In input device 1 (1A, 1B) according to an eighth aspect, an area of a region where first fixed electrode 7 overlaps elastic body 5 as viewed from above is larger than an area of a region where second fixed electrode 8 overlaps elastic body 5 as viewed from above.

According to the configuration described above, electrostatic capacitance C1 between first fixed electrode 7 and elastic body 5 is relatively large. This makes it easy to detect a change in electrostatic capacitance C1.

In input device 1 (1A, 1B) according to a ninth aspect, first fixed electrode 7 has cutout 75, and second fixed electrode 8 is disposed in cutout 75 of first fixed electrode 7.

According to the configuration described above, it is easy to design the area of first fixed electrode 7 to be larger than the area of second fixed electrode 8.

Input device 1 (1A, 1B) according to a tenth aspect further includes stopper 122 (122B) that restricts the movement of movable member 2, where movable member 2 further includes movable electrode 4 positioned below click member 3, and stopper 122 (122B) restricts the movement of movable electrode 4 toward elastic body 5 not beyond a certain position.

According to the configuration described above, elastic body 5 receiving a load of a certain magnitude or more can be suppressed, whereby deterioration of elastic body 5 can be suppressed. That is, the life of elastic body 5 can be prolonged. In addition, the stroke (moving range) of movable member 2 is restricted, so that the feeling of operating input device 1 (1A, 1B) can be made stable.

Input device 1 (1A) according to an eleventh aspect is the tenth aspect in which the outer edge of movable electrode 4 comes into contact with stopper 122 as movable electrode 4 pushes elastic body 5.

According to the configuration described above, the configuration of stopper 122 can be made simple.

In input device 1B according to a twelfth aspect, movable electrode 4 has through hole 76, and the rim of through hole 76 comes into contact with stopper 122B as movable electrode 4 pushes elastic body 5.

According to the configuration described above, the configuration of stopper 122B can be made simple.

In input device 1 (1A, 1B) according to a thirteenth aspect, a plurality of places of movable member 2 comes into contact with stopper 122 (122B) as movable electrode 4 pushes elastic body 5.

According to the configuration described above, movable member 2 is less likely to tilt as compared with a case where stopper 122 (122B) and movable member 2 come into contact with each other by only one place.

The configurations other than the configuration of the first aspect are not essential for input device 1 (1A, 1B), and can be omitted as appropriate.

REFERENCE MARKS IN THE DRAWINGS 1, 1A, 1B input device
2 movable member
3 click member
4 movable electrode (frame-shaped part)
40, 50, 60 through-hole
5 elastic body
6 insulating sheet
61 cutout
7 first fixed electrode
8 second fixed electrode
9 third fixed electrode
10 housing
71 first end
72 second end
73 connecting portion
74 first terminal
75 cutout
76 through-hole
122, 122B stopper
201, 202, 203 contact
301 buckling portion
311 pressure receiver
V1 imaginary line

The invention claimed is:
1. An input device comprising:
a first fixed electrode;
a second fixed electrode electrically insulated from the first fixed electrode;
an elastic body having conductivity and positioned above the first fixed electrode and the second fixed electrode;

a movable member that is positioned above the elastic body and is configured to push the elastic body toward the first fixed electrode;

an insulating layer that is positioned between the first fixed electrode and the elastic body and insulates the first fixed electrode and the elastic body from each other; and a stopper that restricts movement of the movable member, wherein:

the second fixed electrode and the elastic body are in contact with each other, the movable member further includes a movable electrode positioned below the click member, and the stopper restricts movement of the movable electrode toward the elastic body not beyond a certain position.

2. The input device according to claim 1, wherein the second fixed electrode includes an oxide film as an upper film.

3. The input device according to claim 1, wherein the second fixed electrode and the elastic body are electrically connected to each other.

4. The input device according to claim 1, wherein
the movable member includes a click member, and
the click member buckles when pushed with a force of a predetermined magnitude or more.

5. The input device according to claim 4, further comprising a third fixed electrode positioned below the click member, wherein;
the click member has conductivity and is in contact with the elastic body, and
when the movable member is pushed with a force of the predetermined magnitude or more, the click member buckles to cause a portion of the click member to approach the third fixed electrode.

6. The input device according to claim 5, wherein
the first fixed electrode is electrically connected to a ground, or
the second fixed electrode and the third fixed electrode are electrically connected to a ground.

7. The input device according to claim 5, wherein:
one of the second fixed electrode and the third fixed electrode outputs an electric signal, and
one of the first fixed electrode, the second fixed electrode, and the third fixed electrode is electrically connected to a ground.

8. The input device according to claim 1, wherein an area of a region where the first fixed electrode overlaps the elastic body as viewed from above is larger than an area of a region where the second fixed electrode overlaps the elastic body as viewed from above.

9. The input device according to claim 1, wherein
the first fixed electrode has a cutout, and
the second fixed electrode is disposed in the cutout of the first fixed electrode.

10. The input device according to claim 1, wherein as the movable electrode pushes the elastic body, an outer edge of the movable electrode comes into contact with the stopper.

11. The input device according to claim 1, wherein;
the movable electrode has a through hole, and
as the movable electrode pushes the elastic body, a rim of the through hole comes into contact with the stopper.

12. The input device according to claim 1, wherein as the movable electrode pushes the elastic body, a plurality of places on the movable member come into contact with the stopper.

* * * * *